United States Patent [19]

Sato et al.

[11] 4,188,636
[45] Feb. 12, 1980

[54] SEMICONDUCTOR DEVICE HAVING BUMP TERMINAL ELECTRODES

[75] Inventors: Susumu Sato; Hiroshi Shiba, both of Tokyo, Japan

[73] Assignee: Nippon Electric Co., Ltd., Tokyo, Japan

[21] Appl. No.: 891,182

[22] Filed: Mar. 29, 1978

[30] Foreign Application Priority Data

Apr. 1, 1977 [JP] Japan .................................. 52-36996

[51] Int. Cl.² ...................... H01L 23/48; H01L 29/44; H01L 29/52
[52] U.S. Cl. ........................................ 357/71; 357/65; 357/68; 357/69
[58] Field of Search ...................... 357/65, 68, 69, 71

[56] References Cited

U.S. PATENT DOCUMENTS

| | | | |
|---|---|---|---|
| 3,740,523 | 6/1973 | Cohen et al. | 357/71 |
| 3,890,636 | 6/1975 | Harada et al. | 357/71 |
| 4,000,842 | 1/1977 | Burns | 357/71 |
| 4,032,949 | 6/1977 | Bieris | 357/71 |
| 4,051,508 | 9/1977 | Sato et al. | 357/71 |
| 4,054,484 | 10/1977 | Lesh | 357/71 |
| 4,067,039 | 1/1978 | Gaicki | 357/71 |

FOREIGN PATENT DOCUMENTS

| | | | |
|---|---|---|---|
| 2348323 | 4/1975 | Fed. Rep. of Germany | 357/69 |
| 1028424 | 5/1966 | United Kingdom | 357/65 |

OTHER PUBLICATIONS

IBM Technical Disclosure Bulletin; Segmented Stripe Devices; by Ainslie et al., vol. 13, No. 7, Dec. 1970, pp. 2011-2013.

Primary Examiner—Andrew J. James
Attorney, Agent, or Firm—Hopgood, Calimafde, Kalil, Blaustein & Lieberman

[57] ABSTRACT

A semiconductor device is disclosed in which a protrusion is interposed between a bump terminal electrode and the peripheral edge of the semiconductor substrate.

17 Claims, 14 Drawing Figures

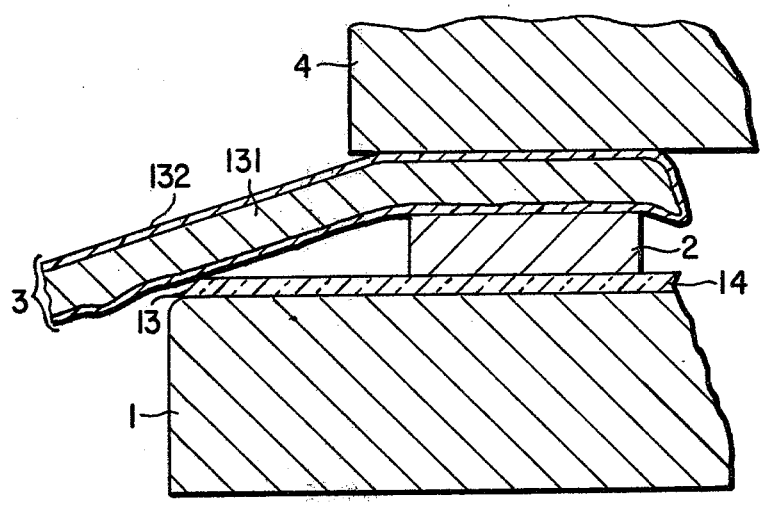
(PRIOR ART)
FIG. I(C)
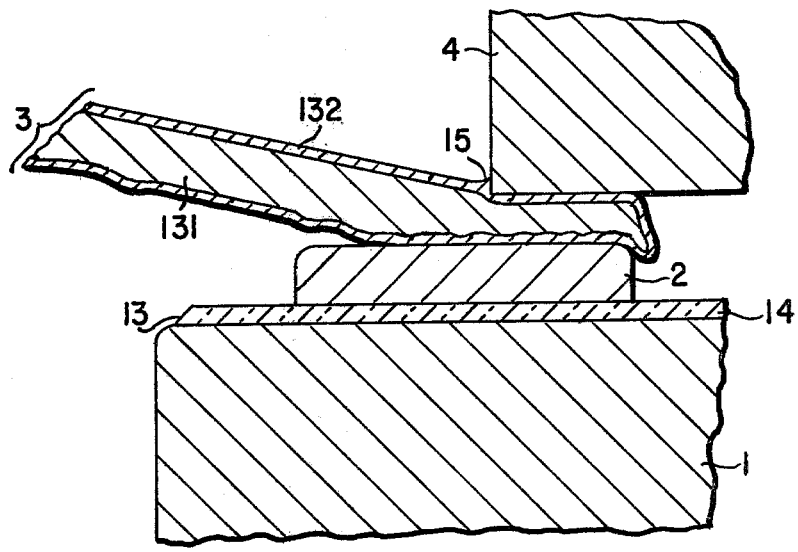
(PRIOR ART)
FIG. I(D)

SEMICONDUCTOR DEVICE HAVING BUMP TERMINAL ELECTRODES

BACKGROUND OF THE INVENTION

1. Field of the invention

This invention generally relates to semiconductor devices, and more particularly, to semiconductor devices having bump terminal electrodes to which metallic connecting leads are bonded.

2. Description of the prior art

Various new methods have been proposed to make electrical connection of connecting leads to the metallic terminal electrodes of semiconductor devices in place of the conventional wire bonding. One technique that has been recently proposed for LSI application is gang bonding in which connecting leads are prepared from a stripe of metal foil on a plastic tape. The end portions of the leads the thinly formed to be directly and simultaneously bonded to the metallic protrusions (bumps) at the IC terminal electrodes. A gang bonding method of this type is described, for example, in U.S. Pat. No. 3,763,404, U.S. Pat. No. 4,051,508, and "SOLID STATE TECHNOLOGY" October, 1975, pp 46–52.

The bumps are usually formed of gold and are located at the edge of a wiring layer extending on the insulating film of the semiconductor substrate and are connected to a region thereof. The bump is about 100 $\mu$m wide at each side and about 10~20 $\mu$m high from the upper surface of the semiconductor substrate. The leads that are to be connected to the bumps consist of tin- or gold-plated copper foils, which have a thickness of 20~40 $\mu$m and a width of about 100 $\mu$m, which is substantially equal to the bump size.

The connection method by tin-plated copper leads is widely used because a gold-tin eutectic can be obtained at a low temperature and under a low bonding pressure. The use of leads of this type, however, present a critical problem wherein the single crystalline tin whisker causes an electric short between the leads. For this reason, gold-plated copper leads are employed in a high reliability device since they show no whisker formation. However, when a gold-plated copper lead is bonded to a gold bump, a greater bonding load is required to obtain satisfactory mechanical strength at the connection between the lead and the bump in comparison with tin-plated copper leads. As a result, both lead and bump cause plastic deformation due to the heat and load applied thereto at the time of bonding and the gap between the lead and the upper surface of the semiconductor element becomes smaller than the height of the bump. Moreover, the size of a bonding tool is generally larger than the size of a square defined by a plurality of bumps in order to facilitate the accurate positioning of the tool with respect to the bumps. This means that the lead is also applied with a load at the external portion of the bump and bent towards the upper surface of the semiconductor element.

Generally, a plurality of semiconductor elements are formed on a single semiconductor wafer. After the electric characteristics of these elements are checked by applying a test probe to the bumps, they are separated into the individual semiconductor elements by scribing with a tapered diamond or a laser beam or by cutting the wafer with a thin diamond wheel. The upper surface of the semiconductor element is covered with an insulating film, e.g. a silicon oxide film, but at the side faces of the element, the semiconductor substrate is exposed. Since the surface-insulating film is generally made of a brittle material, the contour portions of the side faces and the upper surface are chipped off and the semiconductor substrate is also frequently exposed there.

On the other hand, the bonding surface of the copper foil as a base member of the leads, that is, the surface to be attached to an insulating film, is coarsened. Accordingly, when an electrolytic plating of gold is applied to the bonding surface, the unevenness of the bonding surface is further enhanced due to the electrolytic density.

If this lead and semiconductor device are connected by gang bonding, a critical drawback of an electric short-circuit (hereinafter referred to as "edge-short") tends to occur between the bottom surface of the leads and the exposed silicon at the contour portion of the semiconductor substrate because the leads are bent towards the upper surface of the substrate as described previously. Even if isolation is maintained by a slight gap between the leads and the surface of the semiconductor element, such a semiconductor device involves a critical drawback with respect to its reliability in that when the device is incorporated in an apparatus, the edge-short may still occur due to the thermal expansion of the leads, or the contamination of the leads by dust or the like.

In order to solve this problem, another method has been prepared in which bonding is effected after the leads are formed in such a shape as to expand the gap at the edge portion of the semiconductor substrate. However, this plastic forming method significantly lowers the utilization rate of the lead frame because the positions of the tips of the leads are deviated during the formation of the leads especially when a number of leads are used, and a back-spring phenomenon of the copper member occurs. In addition, the method is not an effective counter-measure for the abovementioned bending phenomenon of the leads towards the surface of the semiconductor elements during bonding. For these reasons, this method cannot provide a solution for the edge-short. In yet another method that has been prepared the leads are shaped after they are bonded to the bumps in order to enlarge the gaps between the leads and the contour portions of the semiconductor substrate. However, this method again presents a new problem in that lowering of the strength of the lead itself and strength of the bond are inevitable because the method extends the leads per se. Furthermore, the once shaped leads themselves are again bent during post-treatment or by handling. Hence, this shaping method is also not an effective solution to the problem.

SUMMARY OF THE INVENTION

It is a object of the present invention to provide an semiconductor device in which the connecting leads to be bonded to the bump terminal electrodes do not cause an electric short-circuit to the side edge of the semiconductor substrate.

It is another object of the present invention to provide a highly reliable and economical semiconductor device in which the connecting leads to be bonded to the bump terminal electrodes by gang bonding are not subjected to shaping before or after the bonding, and in which a predetermined gap is maintained between them and the edge or the silicon exposed surface of the semiconductor device.

It is still another object of the present invention to provide semiconductor device which does not require any specific consideration about the electric short-circuit between the connecting leads and the semiconductor substrate in setting the conditions for bonding the leads to the bump terminal electrodes, and which enables the conditions for obtaining sufficiently high bonding strength to be set.

According to one feature of the present invention, there is provided a semiconductor device comprising a bump terminal electrode to be connected to an external connecting lead formed on or above one major surface of the semiconductor substrate, and a protrusion formed between the bump terminal electrode and one edge of the semiconductor substrate.

According to another feature of the present invention, there is provided a semiconductor device comprising a semiconductor substrate, an insulating film formed on the semiconductor substrate, a wiring layer electrically connected to one region of the semiconductor substrate and extending over the insulating film, a bump terminal electrode abutted against the wiring layer and formed on the insulating film, and a protrusion interposed between the bump electrode and the periphery of the semiconductor substrate opposing the bump electrode and formed in the insulating film.

To ensure the effect of the present invention, the distance between the mutually opposed bump edge and protrusion edge preferably ranges from 10 μm to 150 μm, and the most preferably this distance is within a range of 30 to 100 μm.

Moreover, the distance between the side surface portion of the semiconductor substrate and the protrusion edge opposed to the side surface portion advantageously ranges from 20 μm to 150 μm, and that the heights of the protrusion and the bump advantageously substantially equal to each other.

BRIEF DESCRIPTION OF THE DRAWINGS

FIG. 1(C) is an enlarged cross-sectional view showing the relation after bonding among the lead, bumps and bonding tool in the state shown in FIG. 1(B);

FIG. 1(D) is an enlarged cross-sectional view showing another relation of the position among the tool, leads and bumps in bonding the leads to a prior art semiconductor device;

Figure 2A:
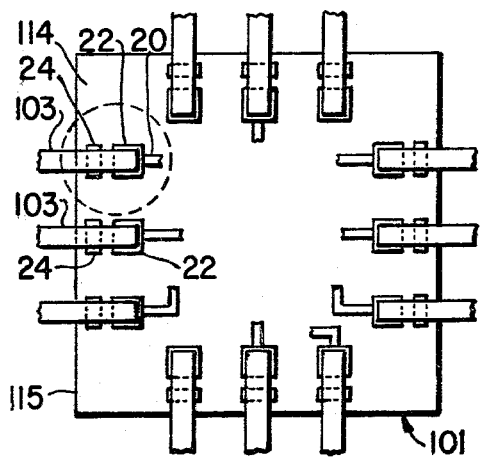
FIG. 2(A) is a plan view showing a semiconductor device according to a first embodiment of the present invention.
Figure 2D:
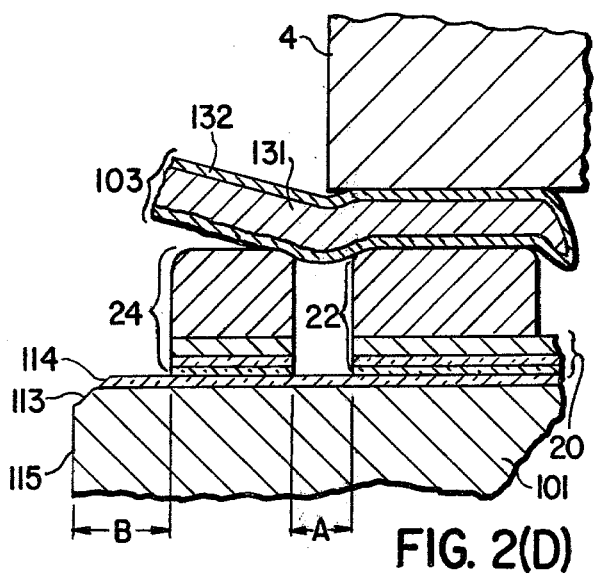
Figure 2B:
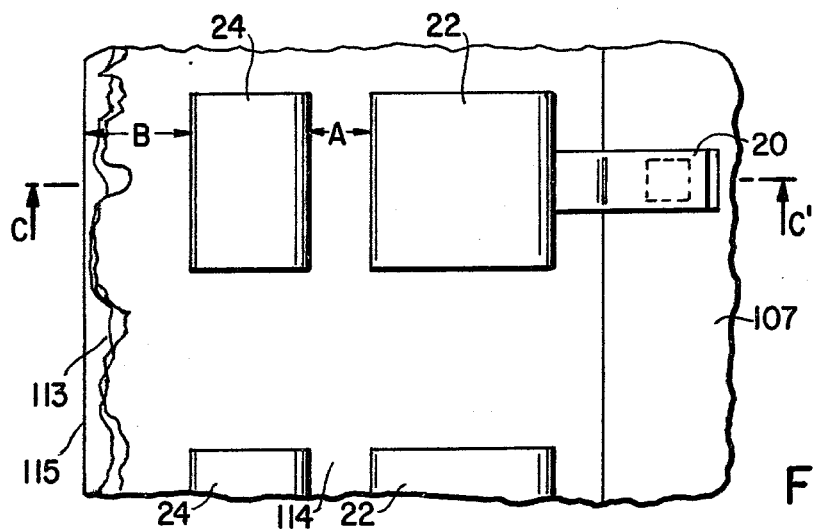
Figure 2C:
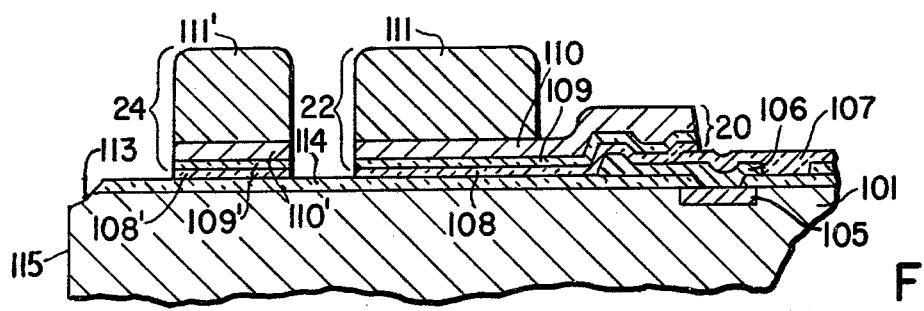
Figure 3A:
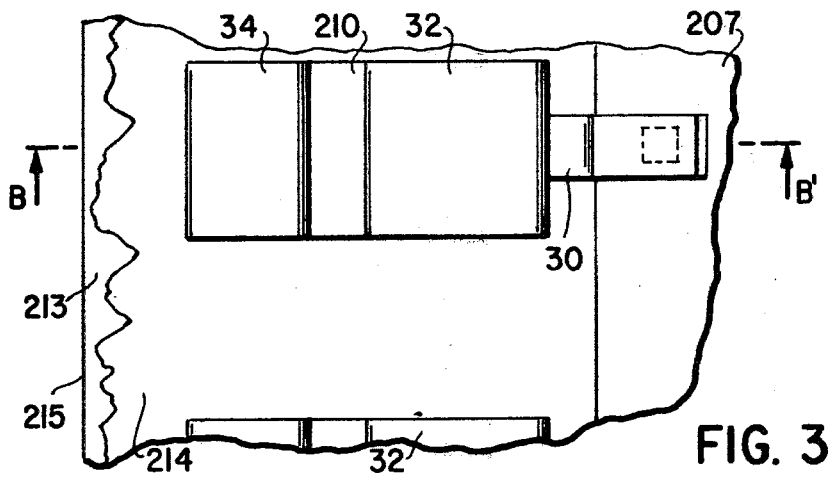
Figure 3B:
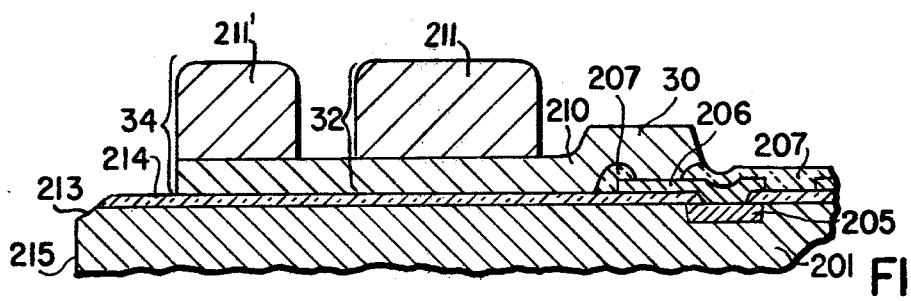
Figure 4A:
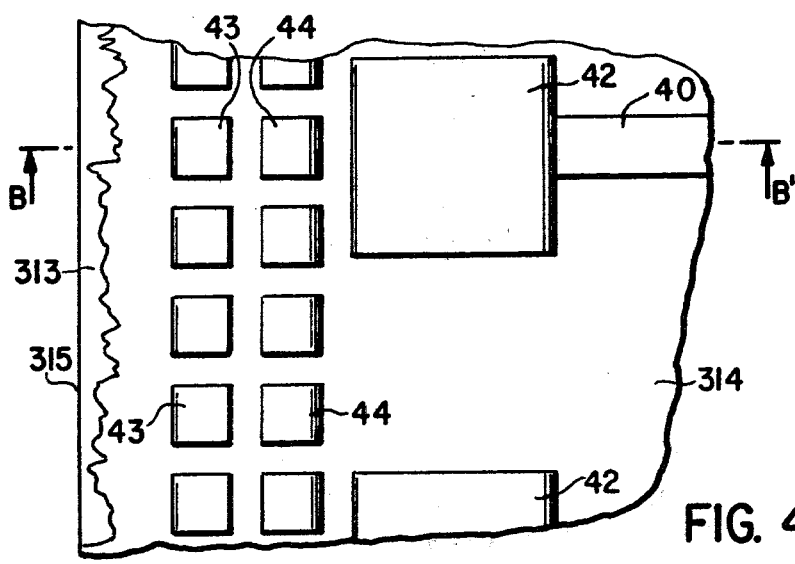
Figure 4B:
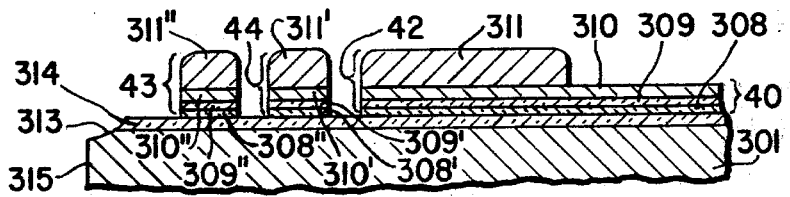
Figure 5A:
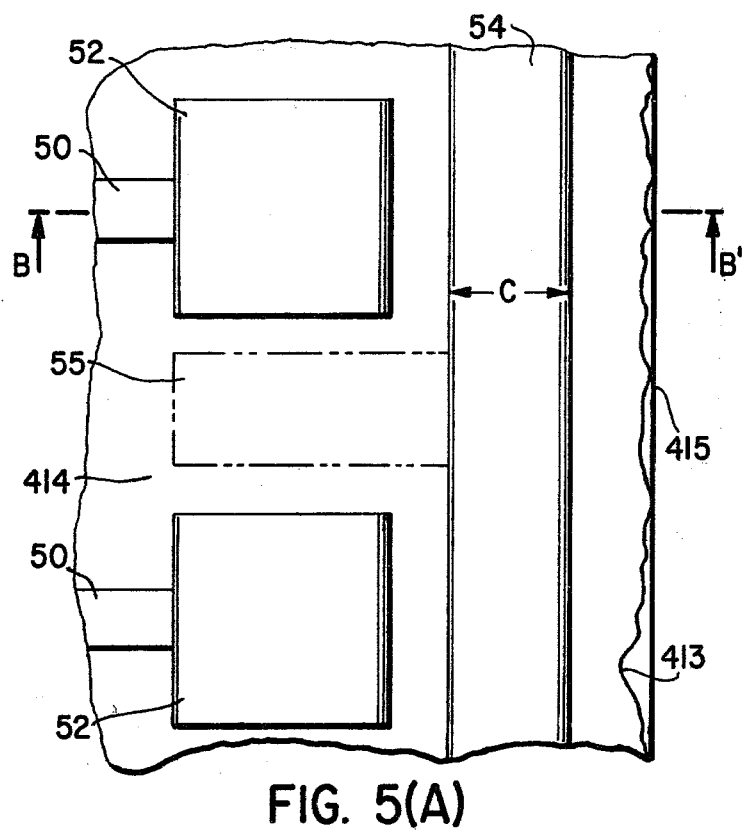
Figure 5B:
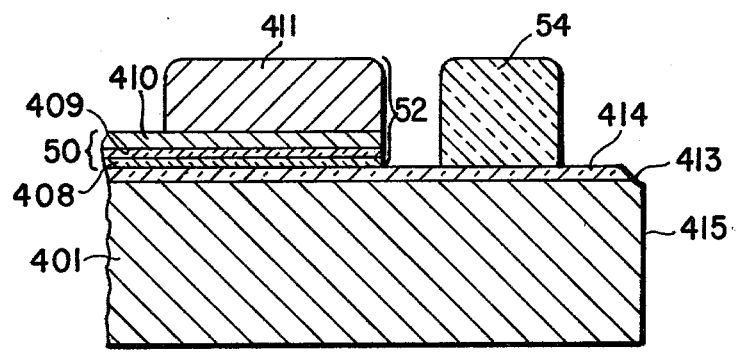

FIG. (B) is an enlarged plan view of the portion of the device encircled by the dotted line in FIG. 2(A);

FIG. 2(C) is a cross-sectional view taken along the line C–C' as viewed in the direction the arrows of FIG. 2(B);

FIG. 2(D) is an enlarged cross-sectional view showing the relation after bonding among the leads and bumps of the semiconductor device shown in FIGS. 2(B) and 2(C), and a bonding tool;

FIG. 3(A) is a plan view showing semiconductor device according to a second embodiment of the present invention;

FIG. 3(B) is a cross-sectional view taken along the line B–B' of FIG. 3(A) as viewed from the direction depicted by the arrow;

FIG. 4(A) is a plan view showing semiconductor device according to a third embodiment of the present invention;

FIG. 4(B) is a cross-sectional view taken along the line B–B' of FIG. 4(A) as viewed from the direction depicted by the arrow;

FIG. 5(A) is a plan view showing semiconductor device according to a fourth embodiment of the present invention; and FIG. 5(B) is a cross-sectional view taken along line B–B' of FIG. 5(A) as viewed from the direction depicted by the arrow.

Figure 1A:
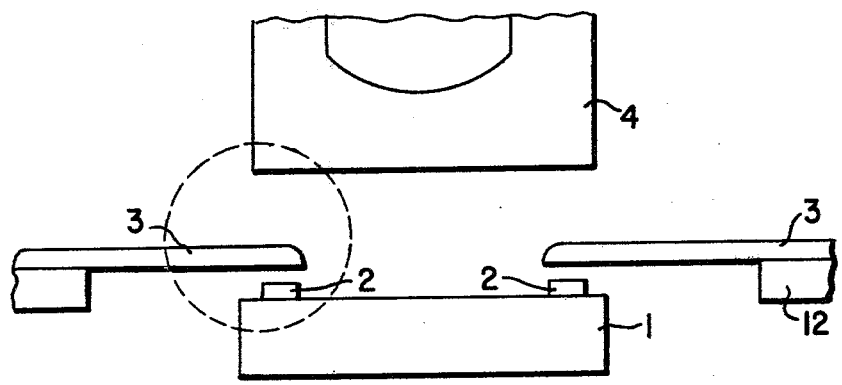
FIG. 1(A) is a cross-sectional view showing a prior art semiconductor device along with its external leads and a bonding tool.

In the typical prior art device shown in FIG. 1(A), bumps 2 are formed on a silicon substrate which has incorporated therein semiconductor elements. The tip of the leads 3 attached to a plastic tape 12 and a bonding tool 4 are positioned in a predetermined relationship to the bumps and leads and then the bonding tool 4 is lowered, thereby applying a mechanical load to the bonding portions between the leads 3 and the bumps 2. When a predetermined load is attained, an electric current is caused to flow through the tool, and the gold leads are bonded by means of the applied mechanical load and the heat generated at the tool by the current flowing therethrough.

Figure 1B:
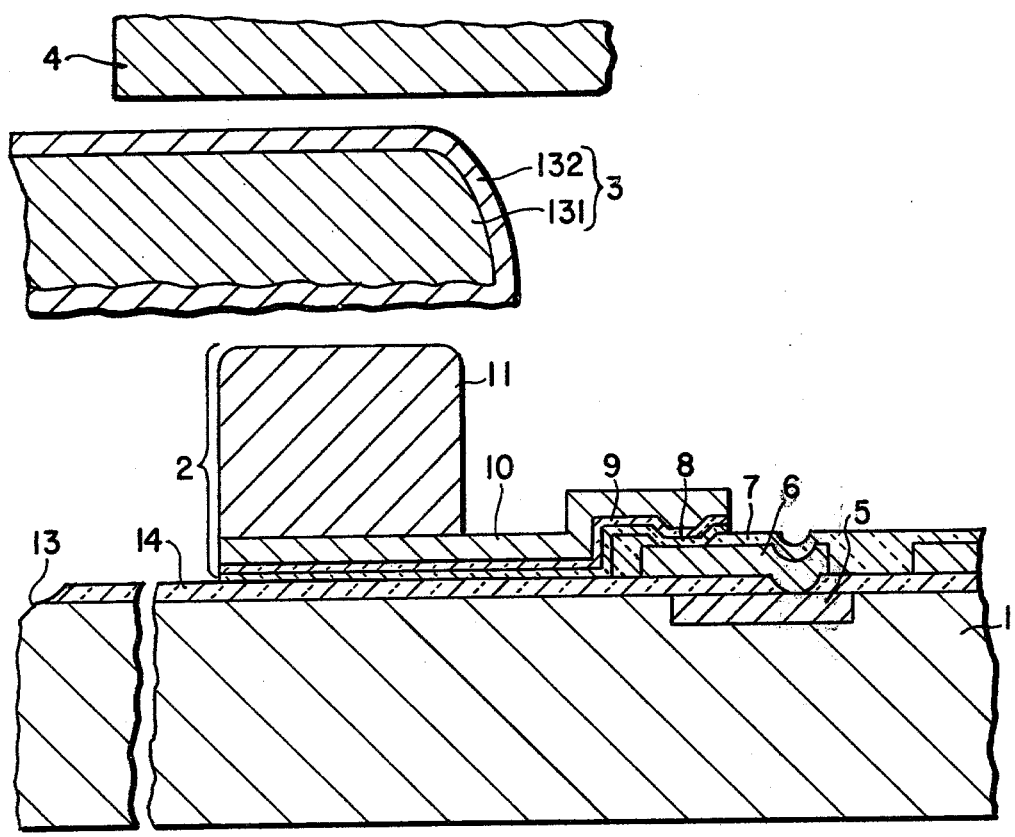
FIG. 1(B) is an enlarged cross-sectional view of the portion encircled by the dotted line in FIG. 1(A) showing details of the semiconductor device and the relation among the leads, bumps and bonding tool.

Aluminum is generally used in a typical prior art device as a material for wiring the active regions of the semiconductor elements and also for the electrodes, whereas the bump is generally made of gold. For the purpose of preventing formation of purple-plague between the aluminum and gold, another conductive layer is formed by a continuous sputtering of a refractory metal and platinum to thereby form an intermediate wiring layer to connect an inner aluminum wiring layer to a bump. In more detail, as shown in FIG. 1(B), a silicon substrate 1 incorporates therein transistors, resistors and the like (not shown) and has an impurity diffused region 5, which is representative of a portion of a circuit element incorporated in the substrate 1. An inner aluminum layer 6 is connected to the diffused region 5 and is formed on an insulating film 14 of $SiO_2$, which covers the major surface of the semiconductor substrate 1. The wiring layer connected to the inner layer 6 via an aperture of an insulating layer 7 consists of a titanium film 8 for obtaining adhesion with insulating film 14, a platinum film 9 as a barrier, and a gold film 10 for wiring. A bump terminal electrode 2 consists of the three films 8, 9, and 10, which extend continuously from the wiring layer, and a thick gold layer 11. The connection lead 3, which is generally made of a copper member 131 and gold-plating 132, is applied onto the surface of the bump terminal electrode in order to effect heat-bonding together with the gold of the bump electrode 2. In the copper as the substrate of the connecting lead, the bonding surface relative to the bump is coarsened and provided with unevenness in order to obtain sufficient adhesion between it and an adhesive applied to the plastic tape 12 (FIG. 1(A), to which the lead is attached. This unevenness is further enhanced when gold is electroplated onto the copper surface. Reference numberal 13 represents the aforementioned cracks and chipping of the contour portion of the semiconductor substrate 1.

The bonding tool 4 is generally wider by several tens μm than the bump electrode 2 in order to ensure bonding even if positioning errors occurs between the tool 4 and the bump electrode 2.

FIG. 1(C) depicts the section of the bump of the prior art semiconductor device of FIG. 1(B) when the lead 3 is bonded to the bump, and the position of the tool at that time. Due to the temperature and load from the bonding tool 4, heat-bonding is effected between the lead 3 and the bump surface. Since the temperature is applied from the side of the bonding tool, the lead is more likely to cause plastic deformation in comparison with the gold bump and, in addition, the lead is downwardly bent because the load simultaneously applied to the lead and to the bump is borne more greatly by the bump.

Though the bump usually has a height of about 10~20 μm, it is crushed by the load at the time of bonding and the lead also is crushed at the bump whereby the gap between the major surface of the semiconductor substrate and the connecting lead becomes smaller. Due to the scribing, separating or cutting process, the aforementioned chipping occurs at the contour portion 13 of the silicon substrate 1 to expose the silicon, thereby incurring the electric edge-short between the lead 3 and the silicon substrate 1. Even when the edge-short would not occur at the initial stage, the edge-short would still tend to occur during the operation of an apparatus in which the semiconductor is incorporated, because of the thermal expension of the lead, or the dust and contamination, etc. or the like. In order to remove the edge-short, if the bump size is such that the bonding tool 4 sufficiently enters the bump 3 as shown in FIG. 1(D), it is possible to prevent the lead 3 from being bent towards the chipping side portion 13. If bonding is effected under this condition, however, a part of the bump below the bonding tool at the edge 15 of the tool also causes plastic deformation whereby a shear force acts on the lead and reduces the strength of the lead itself. Bonding strength including the lead portion must have sufficient strength to withstand machine works (e.g. cutting and bending of the lead) and handling during subsequent process steps. As explained above, even if the bump is larger than the bonding tool in order to cope with the possible edge-short, this method incurs the problem of a reduction in the lead strength, and hence cannot be practically used.

DESCRIPTION OF THE PREFERRED EMBODIMENTS

Embodiment 1

In a semiconductor device of the invention, as in the embodiment shown in FIG. 2(A), a wiring layer 20 is connected to a predetermined region (not shown) of a semiconductor substrate 101. Wiring layer 20 extends on the insulating film 114 and is connected to the bump terminal electrode 22. In accordance with the present invention, a protrusion 24 is formed between the bump electrode 22 and the periphery 115 of the semiconductor substrate 101. The connecting lead 103 is gangbonded to the bump electrode 22 and is taken out from the semiconductor device past the protrusion 24.

As shown in FIGS. 2(B) and 2(C), an inner lead 106 of aluminum connecting with an impurity diffused region 105 as one region of the semiconductor substrate 101 and the wiring layer 20 are mutually and electrically connected past through an aperture of a CVD oxide film 107. The wiring layer 20 consists of a lower titanium film 108 having good adhesion with the insulating film on the semiconductor substrate 101, for example, a silicon dioxide film 114, an intermediate platinum film 109 having a barrier effect, and a gold film 110 (about 2 μm thick) of a low electric resistance as the upper film. The bump terminal electrode 22 consists of an enlarged portion that extends from the wiring layer 20 and a thick gold film (about 15 μm) 111 formed thereon.

The protrusion 24 in accordance with the present invention is interposed between the bump electrode 22 and the peripheral edge 115 of the semiconductor substrate and in this embodiment is made of the same metal construction as that of the bump. The protrusion 24 is provided for the purpose of preventing the connecting lead from being bent towards the semiconductor substrate at the time of bonding. Namely, the protrusion 24 consists, in the same way as the bump contact 22, of a titanium film 108' formed on the silicon dioxide film 114, a platinum film 109', a gold film 110' and a thick gold layer 111' gold-plated in the same way as the bump 22. As illustrated in FIG. 2(B), the protrusion 24 is formed at a position opposed to the bump 22 and is electrically insulated from other bumps as from well as other protrusions. As shown in FIG. 2(D), for the reasons noted, the bonded lead tends to be downwardly bent outside the bump portion 22. Because of the protrusion 24 the connecting lead 103 is lifted upward whereby the gap between the lead 103 and the surface of the semiconductor substrate 101 at the chip edge portion 113 is higher than the height of the protrusion 24 since the protrusion 24 functions as a support point.

It is therefore possible in the present invention to totally eliminate the edge-short that occurs in a semiconductor device having conventional electrode contacts.

In order to ensure the advantages of the present invention, the gap A between the mutually opposed bump edge and the edge of the protrusion is favorably 10 μm or more, though this gap may vary to some extent depending on the positioning accuracy of the bump and the tool. This is because the edge of the tool 4 must not touch on the protrusion, and the optimum value of the gap A, e.g. more than 10 μm, is determined in accordance with the machining accuracy of the tool and the accuracy of production apparatuses including the optic system. In view of the integration density in an IC chip, the gap A is favorably not greater than 150 μm for practical application. Also, the most favorable value for gap A falls within the range of 30 to 100 μm.

The height of the protrusion 24 from the surface of the insulating film 114 is preferably the same as, or higher than, the height of the bump 22. This enables the formation of the protrusion 24 in the same process as the bump 22. When the connecting lead 103 is heat-bonded to the bump 22, it causes plastic deformation due to the load and heat at that time so that the height of the protrusion 24 is eventually higher than that of the bump 22. Since the thick gold film 111 of the bump is usually thicker than 4 μm, the protrusion 24 becomes higher than 4 μm.

The distance B from the peripheral edge 115 to the edge of the protrusion 24 is favorably at least 20 μm in view of the positioning accuracy of scribing, cutting or chipping. The minimum value for this distance is determined by the cutting margin, positioning at the time of cutting, chipping and like factors. On the other hand, the protrusion is preferably positioned as near as possible to the edge of the substrate so as to ensure the prohibition effect of the edge-short. This determines the maximum effective distance of the distance. From these aspects, the value B favorably falls within the range of 20 to 150 μm. In addition, since the side of the bonding tool 4 is linear, a plurality of protrusions 24 are favorably aligned in parallel with the edge portion 115 of the substrate.

Embodiment 2

In the embodiment of the invention shown in FIGS. 3(A) and 3(B), an inner wiring 206 connecting to an impurity region 205 as one region of a semiconductor substrate 201 is electrically connected to the wiring layer 30 consisting of an aluminum film 210 passed through an aperture of an insulating film 207. A gold layer 211 is formed on the portion of the aluminum film 210 having an enlarged width and forms the bump terminal electrode 32 in cooperation with the aluminum film 210. The protrusion 34 in this embodiment is constructed by extending the aluminum film 210 as the lower layer of the bump 32 toward a peripheral edge 215 of the semiconductor substrate and forming a gold layer 211' thereon. In other words, the bump 32 and the protrusion 34 in this embodiment are made by forming the gold layers 211, 211' on an extension of the wiring layer 30. Hence, the bump 32 and the protrusion 34 are electrically connected to each other through the aluminum film 210 as the lower layer.

The protrusion 34 in this embodiment can be formed using the same material and by the same process as required for the formation of the bump 32 in the same way as in the first embodiment. Accordingly, the protrusion 34 can be formed by adding the pattern of the protrusion to the mask used for forming the wiring layer and bump without calling for any additional process. Since the lowermost layer of the bump 32 as well as the protrusion 34 is formed by the aluminum film 210 continuously extending from the wiring layer 30, their adhesion area with respect to the insulating film 214 becomes greater and hence the adhesion strength also is enhanced.

Embodiment 3

In the embodiment of the invention shown in FIGS. 4(A) and 4(B), a plurality of protrusions 43, 44 having a small area are interposed between the bump 42 and a peripheral edge 315 of the semiconductor substrate 301. In the previously described embodiments of the invention, the protrusion is disposed so as to mate with the corresponding bump. However, the present invention is not necessarily limited with respect to the shape in plane, size, or number of the protrusions and the corresponding bumps as indicated by this embodiment. Though the protrusion in the foregoing embodiments is made of the same material and by the same process as required to form the bump, the same effect can be obtained by making the protrusion from a dielectric material. If a plurality of small protrusions are provided, as in this embodiment, the protrusions are preferably floated electrically from the bump, as in the first embodiment, in case the protrusions are made of an electrically conductive material. That is, in this embodiment, too, the wiring layer 40 extends over an oxide film 314 and consists of a titanium film 308, a platinum film 309, and a thin gold film 310. The bump contact 42 is constructed by forming a thick gold layer 311 at the edge of the wiring layer 40 at which the width thereof is expanded. Two lines of protrusions 43, 44 are aligned in parallel with the edge 315 of the semiconductor substrate and each protrusion is formed by a titanium film 308', 308", a platinum film 309', 309", a thin gold film 310', 310", and a thick gold layer 311', 311" in the same way as the bump 42.

EMBODIMENT 4

In the embodiment of the invention shown in FIGS. 5(A) and 5(B), the wiring layer 50 consists of a titanium film 408 formed on an insulating film 414 on a semiconductor substrate 401, a platinum film 409 and a gold film 410, and the bump terminal electrode 52 is constructed by plating a thick gold layer 411 on the extension of the wiring layer having an expanded width in the same way as in the foregoing embodiments. Reference numeral 413 designates the chipping portion at the time of cutting and separation of the silicon substrate 401.

In this embodiment, the protrusion 54 between the bump 52 and the edge 415 of the semiconductor substrate 401 is made of a dielectric material. The dielectric protrusion 54 is formed by a screen printing process using a pattern formed on a stainless net of a fine mesh after the formation of the thick gold-plated film 411 of the bump in the wafer state. That is, the screen mask is positioned onto the wafer after the bump 52 is formed, and a low melting glass paste or a dielectric resin paste, for example, is printed by a squeegee and thereafter sintered to obtain the dielectric protrusion.

Because of the property of the material, the dielectric protrusion 54 can be continuously formed as shown in the drawing, but it may naturally be separated as in the other embodiments. The shape of the protrusion comprised of 55,54 may be such that it is interposed between an adjacent pair of bumps 52 as indicated in FIG. 5(A) by the broken line. Since it is difficult to obtain a fine pattern of protrusions by a thick film screen printing process on account of the nature of the production technique, the width C of the protrusion of a dielectric material is usually 80 μm or more and its thickness is favorably in the range of 10 to 30 μm.

As can be clearly appreciated from the foregoing explanation of several embodiments of the invention, the electrode contact in accordance with the present invention can completely prevent the electric edge-short between the lead and the peripheral surface of the semiconductor substrate. Accordingly, the present invention makes it possible to economically perform simultaneous bonding of a number of leads of a highly integrated semiconductor device in high quality and provides extremely great industrial advantages.

Although the foregoing explanation deals with the construction of an integrated circuit having a lead gold-plated to the copper member and gold bump by way of example, the materials and compositions of the connecting lead, the bump and the protrusion of the present invention are not particularly limited to these examples. It would therefore be obvious to those skilled in the art that the protrusion of the present invention can be applied, for example, to a lead tin-plated to a copper member and to transistors, diodes and the like.

We claim:

1. A semiconductor device comprising; a semiconductor substrate, an insulating film covering at least a portion of the surface of said substrate, a bump terminal electrode formed on a portion of said insulating film, and a protrusion formed between said bump terminal electrode and the peripheral edge of said semiconductor substrate opposing said bump terminal electrode, said protrusion being separated from said bump terminal electrode by a predetermined distance, and a lower surface of said protrusion being directly attached to said insulating film.

2. A semiconductor device comprising; a semiconductor substrate, an insulating film formed on said semiconductor substrate, a wiring layer electrically connected to one region of said semiconductor substrate and extending on said insulating film, a bump terminal electrode electrically connected to said wiring layer and formed on said insulating film, a connecting lead bonded to the upper surface of said bump terminal electrode and extending outwardly from said semiconductor substrate, and a protrusion formed on said insulating film between said bump terminal electrode and the peripheral edge of said semiconductor substrate opposing said bump terminal electrode, said protrusion being positioned under said connecting lead, and said connecting lead not being fixed to said protrusion.

3. The semiconductor device of claim 1 or 2, in which said protrusion is made of the same material as that of said bump terminal electrode.

4. The semiconductor device of claim 3, in which the lowermost layer of said protrusion and of said bump terminal electrode is continuously formed on said insulating film.

5. The semiconductor device of claim 1 or 2, in which said protrusion and said bump terminal electrode have the same construction as that of said wiring layer with the exception of their uppermost layer.

6. The semiconductor device of claim 1 or 2, in which at least two protrusions having a smaller planar shape than that of said bump terminal electrode are formed on said insulating film between said bump terminal electrode and the peripheral edge of said semiconductor substrate.

7. The semiconductor device of claim 1 or 2, in which said protrusion is made of a dielectric material.

8. The semiconductor device of claim 7, in which said protrusion extends in parallel with a plurality of said bump terminal electrodes.

9. The semiconductor device of claim 1 or 2, in which a plurality of said protrusions are aligned in parallel with the peripheral edge of said semiconductor substrate.

10. The semiconductor device of claim 1 or 2, in which a gap between said protrusion and the peripheral edge of said semiconductor substrate ranges from 20 to 150 $\mu$m.

11. The semiconductor device of claim 1 or 2, in which the gap between said bump terminal electrode and said protrusion ranges from 30 to 100 $\mu$m.

12. The semiconductor device of claim 1 or 2, in which the height of said protrusion is at least 4 $\mu$m.

13. The semiconductor device of claim 1 or 2, in which the height of said protrusion is substantially equal to that of said bump terminal electrode.

14. The semiconductor device of claim 7, in which the height of said protrusion ranges from 10 to 30 $\mu$m.

15. The semiconductor device of claim 1 or 2, in which the shape in plan view of said protrusion is substantially the same as that of said bump terminal electrode.

16. The semiconductor device of claim 3, in which said protrusion includes a titanium film contacting said insulating film, a platinum film on said titanium film, and a gold layer on said platinum film.

17. The semiconductor device of claim 3, in which said protrusion includes an aluminum film touching said insulating film and a gold layer on said aluminum film.

* * * * *